(12) United States Patent
Qian et al.

(10) Patent No.: US 12,343,716 B1
(45) Date of Patent: Jul. 1, 2025

(54) DEVICE AND METHOD FOR PRODUCING THIN-FILM CATALYST

(71) Applicant: SUZHOU TAONE SINCERE NANOMATERIAL TECHNOLOGY CO., LTD., Suzhou (CN)

(72) Inventors: Ruoqi Qian, Suzhou (CN); Jingji Qian, Suzhou (CN)

(73) Assignee: SUZHOU TAONE SINCERE NANOMATERIAL TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 19/055,567

(22) Filed: Feb. 18, 2025

Related U.S. Application Data

(63) Continuation of application No. 18/567,025, filed as application No. PCT/CN2021/123370 on Oct. 12, 2021.

(30) Foreign Application Priority Data

Jul. 9, 2021 (CN) .......................... 202110780326.0

(51) Int. Cl.
*C23C 14/50* (2006.01)
*B01J 37/34* (2006.01)
*C23C 14/32* (2006.01)
*C23C 14/56* (2006.01)

(52) U.S. Cl.
CPC ............. *B01J 37/347* (2013.01); *C23C 14/32* (2013.01); *C23C 14/505* (2013.01); *C23C 14/56* (2013.01)

(58) Field of Classification Search
CPC .................................................. C23C 14/505
See application file for complete search history.

(56) References Cited

U.S. PATENT DOCUMENTS

| 3,675,624 A | 7/1972 | Hunts et al. |
| 3,884,787 A * | 5/1975 | Kuehnle ............... C23C 14/562 204/192.12 |
| 4,342,044 A | 7/1982 | Ovshinsky et al. |

(Continued)

FOREIGN PATENT DOCUMENTS

| CN | 2174480 Y | 8/1994 |
| CN | 1300328 A | 6/2001 |

(Continued)

*Primary Examiner* — Keath T Chen
(74) *Attorney, Agent, or Firm* — Bayramoglu Law Offices LLC

(57) ABSTRACT

A device and method for producing a thin-film catalyst are provided. The device includes a vacuum chamber, a plurality of evaporators, a plurality of gas guide pipes, an ion generator, and a control unit. The plurality of evaporators are configured to evaporate at least one film material. The plurality of gas guide pipes are configured to introduce a reactive gas. The ion generator is configured to ionize the reactive gas and the evaporated film material. The control unit is configured to control the vacuum chamber to be vacuumed, control at least two evaporators of the plurality of evaporators to be simultaneously started, control the plurality of gas guide pipes to introduce the reactive gas, and control an ion source current of the ion generator to be adjusted, such that the evaporated film material reacts with the reactive gas to form a catalytic film layer on a surface of a substrate.

21 Claims, 5 Drawing Sheets

(56) References Cited

U.S. PATENT DOCUMENTS

| | | | | |
|---|---|---|---|---|
| 5,400,892 A | * | 3/1995 | Gentric | H01L 21/68 198/345.2 |
| 5,972,160 A | * | 10/1999 | Straemke | D06B 17/005 156/345.43 |
| 8,460,746 B2 | * | 6/2013 | Dadd | B05D 1/60 427/255.6 |
| 8,894,769 B2 | | 11/2014 | Chaix et al. | |
| 2006/0216161 A1 | * | 9/2006 | Chaix | C30B 23/02 417/313 |
| 2021/0074542 A1 | * | 3/2021 | Atanackovic | H10H 20/012 |

FOREIGN PATENT DOCUMENTS

| | | |
|---|---|---|
| CN | 1441080 A | 9/2003 |
| CN | 1554801 A | 12/2004 |
| CN | 113413895 A | 9/2021 |
| JP | 2002161354 A | 6/2002 |
| JP | 2009050827 A | 3/2009 |
| JP | 2010084153 A | 4/2010 |
| JP | 2010106339 A | 5/2010 |
| JP | 2011195925 A | 10/2011 |
| JP | 2013167007 A | 8/2013 |
| JP | 2018503942 A | 2/2018 |
| JP | 2021505776 A | 2/2021 |
| TW | 200821398 A | 5/2008 |
| WO | 2015097898 A1 | 7/2015 |

\* cited by examiner

DEVICE AND METHOD FOR PRODUCING THIN-FILM CATALYST

CROSS REFERENCE TO THE RELATED APPLICATIONS

This application is a continuation-in-part application of U.S. application Ser. No. 18/567,025, U.S. application Ser. No. 18/567,025 is the national phase entry of International Application No. PCT/CN2021/123370, filed on Oct. 12, 2021, which is based upon and claims priority to Chinese Patent Application No. 202110780326.0, filed on Jul. 9, 2021, the entire contents of which are incorporated herein by reference.

TECHNICAL FIELD

The present disclosure relates to the technical field of catalysts, and in particular to a device and method for producing a thin-film catalyst.

BACKGROUND

With the continuous development of industrial technologies, catalysts, known as the "modern industrial base", play an important role in various production and environmental protection fields. 80% or more of chemical processes require heterogeneous catalysts, which are mainly supported metal catalysts. Supported catalysts have a very wide application range, and play an irreplaceable role in aspects such as ammonia synthesis, carbon-based resource conversion, fine chemicals, pollutant treatment, drug synthesis, and new energy battery membranes. However, the existing preparation processes for large-scale production of catalysts, such as impregnation, co-precipitation, and ion exchange methods, have disadvantages such as high pollution, difficult control of an impurity content, and a lack of full control over stability (including high-temperature stability) and repeatability.

In addition, studies have shown that medium-entropy alloy (MEA)/high-entropy alloy (HEA) thin-film catalysts and multi-metallic element ceramic thin-film catalysts have a high adjustable degree of freedom (DOF), and involve lattice distortion that can optimize electronic structures of active sites. Moreover, the HEA thin-film catalysts and the multi-metallic element ceramic thin-film catalysts can maintain the relative stability of single-phase structures in high-temperature and corrosive application environments due to a hysteretic diffusion effect and can maintain the thermodynamic and kinetic stability under extreme conditions due to a combined high-entropy effect. Therefore, the research, development, and application of novel catalyst preparation processes are imperative.

Currently, although the HEA thin-film catalysts and the multi-metallic element ceramic thin-film catalysts can also be produced by chemical vapor deposition (CVD) and atomic layer deposition (ALD), these methods are extremely inefficient and expensive. The HEA thin-film catalysts can also be produced by a hydrothermal method, a sol-gel method, and an electrochemical method, but these methods involve high pollution, high cost, and low catalyst adhesion. The HEA thin-film catalysts and the multi-metallic element ceramic thin-film catalysts can also be prepared by a carbothermal shock (CTS) method, but this method has the disadvantages that a liquid precursor is still required, only a conductive carrier can be adopted as a carrier, and there is lower control of a morphology of a high-entropy nanoalloy than the method provided by the present disclosure.

SUMMARY

In view of the above-mentioned technical problems, the present disclosure provides a device and method for producing a thin-film catalyst, which can solve the problem that the methods for producing MEA/HEA thin-film catalysts or multi-metallic element ceramic thin-film catalysts in the prior art have disadvantages such as low production efficiency, long film-forming time, high cost, and heavy pollution, and cannot allow the large-scale industrial production.

In order to allow the above objective, the present disclosure provides a device for producing a thin-film catalyst, including: a vacuum chamber configured to create a vacuum environment; a plurality of evaporators arranged in the vacuum chamber and configured to evaporate at least one film material, each evaporator being provided with a shutter; a plurality of gas guide pipes arranged in the vacuum chamber and configured to introduce a reactive gas; an ion generator arranged in the vacuum chamber and configured to ionize the reactive gas and an evaporated film material; and a control unit connected to the vacuum chamber, the plurality of evaporators, the plurality of gas guide pipes, and the ion generator, where the control unit is configured to control the vacuum chamber to be vacuumed, control at least two evaporators of the plurality of evaporators to be simultaneously started, control the plurality of gas guide pipes to introduce the reactive gas, and control an ion source current of the ion generator to be adjusted, such that the evaporated film material reacts with the reactive gas to form a catalytic film layer on a surface of a substrate through vapor deposition.

The thin-film catalyst is an MEA/HEA thin-film catalyst or a high-entropy ceramic (HEC) thin-film catalyst or a multi-metallic element ceramic thin-film catalyst.

The device further includes: a winding mechanism, where the winding mechanism is rotatably arranged in the vacuum chamber and configured to drive the substrate to rotate along a central axis of the vacuum chamber. The winding mechanism includes a plurality of plates and a plurality of rollers rotatably connected between two opposite side plates of the plurality of plates. Each of the plurality of rollers rotates along an axis perpendicular to the central axis, the substrate wrapped on the rollers is driven to rotate along the central axis of the vacuum chamber and conveyed along the axis of each of the plurality of rollers simultaneously. A motor is provided on one of the two opposite side plates for driving the rollers to rotate along respective axes of the rollers. The motor can be powered by an external power source through a brush.

As an optional technical solution, the plurality of evaporators include at least one first evaporator and at least one second evaporator; and the at least one first evaporator is an electron beam or laser evaporator, and the at least one second evaporator is a resistive evaporator.

As an optional technical solution, the device further includes: a rotary actuator, where the rotary actuator includes a motor, a common turntable, a first support ring, a second support ring, a turntable support frame, and a winding mechanism support frame; the common turntable, the first support ring, and the second support ring are arranged in parallel; an output shaft of the motor of the rotary actuator is connected to a central shaft of the common turntable; the winding mechanism is movably fixed on the winding mechanism support frame; the winding mechanism support frame is arranged between the first support ring and the second support ring, and two ends of the winding mechanism support frame are connected to the first support ring and the second support ring, respectively; two ends of the turntable support frame are connected to the common turntable and the first support ring, respectively; and the motor of the rotary actuator drives the common turntable to rotate to drive the winding mechanism support frame to rotate and thus drive the winding mechanism to rotate.

As an optional technical solution, the device further includes: a negative bias generator arranged in the vacuum chamber, where the negative bias generator is configured to provide a negative bias to generate an electric field in the vacuum chamber.

As an optional technical solution, the negative bias is U, and −380 V≤U<0 V.

As an optional technical solution, the device further includes: a cold trap system and a heating system, where the cold trap system and the heating system are arranged in the vacuum chamber.

As an optional technical solution, an ion source of the ion generator is a Hall ion source.

The present disclosure also provides a method for producing the thin-film catalyst using the device described above, including:

step 1: starting vacuuming of the vacuum chamber;
step 2: starting the ion generator to purge the substrate, where the ion source current of the ion generator is a first current; and
step 3: with the ion source current being the first current, introducing a first reactive gas, simultaneously starting the plurality of evaporators to pretreat raw materials in respective evaporators, and when the raw materials reach a preset evaporation condition, triggering shutters of the respective evaporators to open to allow the raw materials to evaporate from the respective evaporators to deposit on the substrate to form a first catalytic film layer on the substrate through the vapor deposition, where the first catalytic film layer is at least one compound of a first metal or a composite of the at least one compound, where the at least one compound of the first catalytic film layer is an oxide, a nitride, a carbide, a sulfide, a boride, or a complex.

As an optional technical solution, the pretreatment of the raw materials includes heating the raw materials to molten state. The raw materials include ceramics, metals, and non-metals in granular, powdered, or structured form. Preferably, the structured form is cube.

As an optional technical solution, the preset evaporation condition is determined, according to different raw materials used, by the amount of the raw materials, the shape and size of beam, the current of beam, the time the beam acting on the raw materials, etc.

As an optional technical solution, the shutters are triggered to open when the raw materials are monitored to reach the preset evaporation condition by a monitor configured in the control unit. Preferably, the preset evaporation condition is set the same for all evaporators such that the shutters will be triggered to open at the same time, namely, the deposition of the raw materials from the plurality of evaporators to the substrate occurs simultaneously.

As an optional technical solution, the first reactive gas is selected from one of oxygen, nitrogen, and methane. The raw materials from different evaporators, after evaporating from respective evaporators, react with each other and combined with the first reactive gas to form compound(s) to deposit on the substrate to form the first catalytic film layer.

For example, when oxygen is used as the first reactive gas, and molten iron and molten nickel are evaporated from different evaporators, iron, nickel, and oxygen will react and combined to form compound $Fe_xNi_yO_z$.

As an optional technical solution, after the step 3, the method further includes:

step 4: adjusting the ion source current to a second current, and introducing a second reactive gas to form a second catalytic film layer on the first catalytic film layer through the vapor deposition, where the second current is smaller than the first current, and the second catalytic film layer is at least one compound of a second metal or a composite of the at least one compound, where the at least one compound of the second catalytic film layer is an oxide, a nitride, a carbide, a sulfide, a boride, or a complex; and step 5: repeating the step 3 and the step 4 sequentially according to a preset number of the catalytic film layer, where the ion source current adopted for a preparation of an outermost catalytic film layer far away from the substrate is the first current.

As an optional technical solution, the first reactive gas and the second reactive gas both are selected from one of oxygen, nitrogen, and methane.

As an optional technical solution, the first catalytic film layer and the second catalytic film layer both are a metal oxide, and the second current could be 0.

As an optional technical solution, the first current is 5 A to 10 A, and the second current is 0 A to 5 A.

As an optional technical solution, a film-forming time of the first catalytic film layer and a film-forming time of the second catalytic film layer both are less than or equal to 5 min. It should be noted that the film-forming time refers to a time period within which the first/second catalytic film is prepared on the substrate part located in the evaporation deposition area. However, because the substrate keeps revolving/rotating under the drive of the winding mechanism, there will always be new substrate part that has not been subjected to deposition appearing in the evaporation deposition area. For example, there is a substrate having a total length of 60 m, the evaporation deposition area can only accommodate substrate of 1 m in length, during the film-forming time, the first/second catalytic film can be prepared only on the 1 m substrate located in the evaporation deposition area, after completion, new substrate part will be transmitted into the evaporation deposition area at a certain rate through the rotation of the rollers until the entire 60-m substrate is transmitted into the evaporation deposition area for the preparation of catalytic film. In this way, there is no need to open the vacuum chamber to supplement substrate and raw materials.

As an optional technical solution, in the step 2, argon is also introduced.

As an optional technical solution, a flux of the argon in the step 3 is equal to a flux of the argon in the step 4.

As an optional technical solution, the second catalytic film layer has a thickness of 5 nm to 30 nm.

As an optional technical solution, the first catalytic film layer has a thickness of 5 nm to 30 nm.

As an optional technical solution, the step 3 further includes: providing a negative bias to generate an electric field, where the negative bias is U, and −380 V≤U<0 V.

As an optional technical solution, a film-forming time of the first catalytic film layer is 2 min to 3 min.

As an optional technical solution, when the first current is 0 A to 5 A, the first catalytic film layer has a specific surface area (SSA) of 20 m$^2$/g to 200 m$^2$/g; and when the first current is 5 A to 10 A, the first catalytic film layer has an SSA of 0.2 m$^2$/g to 20 m$^2$/g.

Compared with the prior art, the technical solutions of the present disclosure have the following advantages:

(1) In the present disclosure, a multi-emission source co-evaporation ion reaction method is used in combination with an ion source+argon mixed ionization method, which can not only solve the problem that a non-co-evaporated film catalyst has poor high-temperature resistance, but also make various element ions in the vacuum chamber collide with each other under a joint action of accelerated impacts of an ion source and argon ions to allow an ion reaction and make a reaction product quickly deposited on a target substrate to form a sub-nano-scale or nano-scale amorphous or crystalline thin-film.

(2) In the present disclosure, a film material is excited to produce ions at a high speed, and ions react with each other rapidly, such that a film-forming time is short, which breaks the conventional practice that the previous film-forming time is measured in hours, can allow a rapid and large-scale multi-metal element ion reaction to prepare MEA/HEA thin-film catalysts and multi-metallic element ceramic thin-film catalysts, and lays a foundation for industrial large-scale production.

(3) In the present disclosure, a negative bias is also applied on the substrate in the vacuum chamber to accelerate the deposition of ions or compounds and further allow an ion reaction on a primary film, so as to produce increased HEAs or complexes, which can improve the stability of active sites of a catalyst, especially the stability of high-temperature resistance. The laminated thin-film catalyst prepared by the method of the present disclosure is a non-van der Waals force two-dimensional (2D) film with high binding forces and stable active sites.

(4) The production system of the present disclosure involves cheap raw materials, and a cost of raw materials (film materials) of the production system is greatly reduced compared with a cost of magnetron sputtering targets. The production process of the present disclosure does not produce acids, alkalies, and solid and liquid waste, and a small amount of a vacuuming gas involved by the production process can meet discharge standards and be discharged after being filtered through a simple gas filter, indicating that the production process is eco-friendly. Moreover, the production process of the present disclosure is reliable and stable.

BRIEF DESCRIPTION OF THE DRAWINGS

To describe the technical solutions in the specific implementations of the present disclosure or the prior art more clearly, the accompanying drawings required for describing the specific implementations or the prior art are briefly described below. Apparently, the accompanying drawings in the following description show merely some implementations of the present disclosure, and a person of ordinary skill in the art may still derive other accompanying drawings from these accompanying drawings without creative efforts.

DETAILED DESCRIPTION OF THE EMBODIMENTS

In order to further understand the objectives, structures, features, and functions of the present disclosure, the present disclosure is described in detail below with reference to embodiments. It should be noted that orientations or position relationships indicated by terms such as "upper", "lower", "left", and "right" are orientations or position relationships shown in the accompanying drawings, and a shape, size, and orientation or position relationship of each component shown in the accompanying drawings are merely to facilitate the description of the technical content of the present disclosure and thus cannot be understood as a limitation to the present disclosure.

Figure 1:
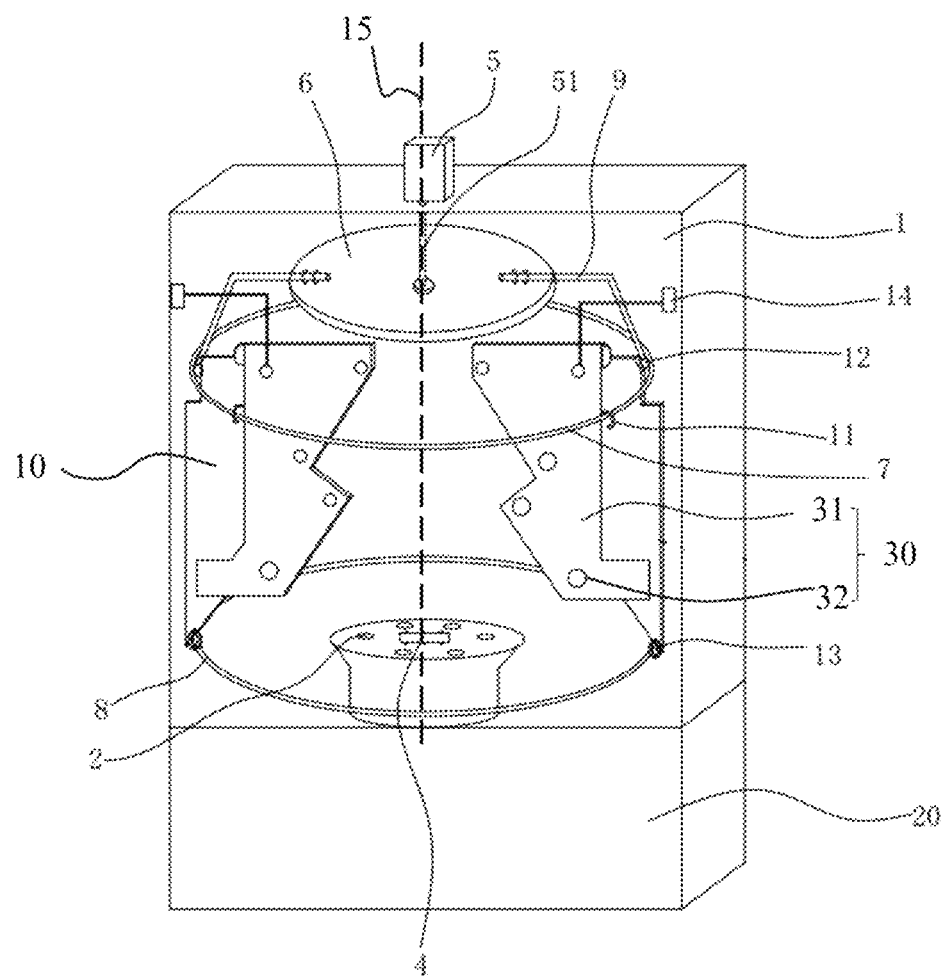
FIG. 1 is a schematic diagram of a device for producing a thin-film catalyst in an embodiment of the present disclosure.
Figure 2:
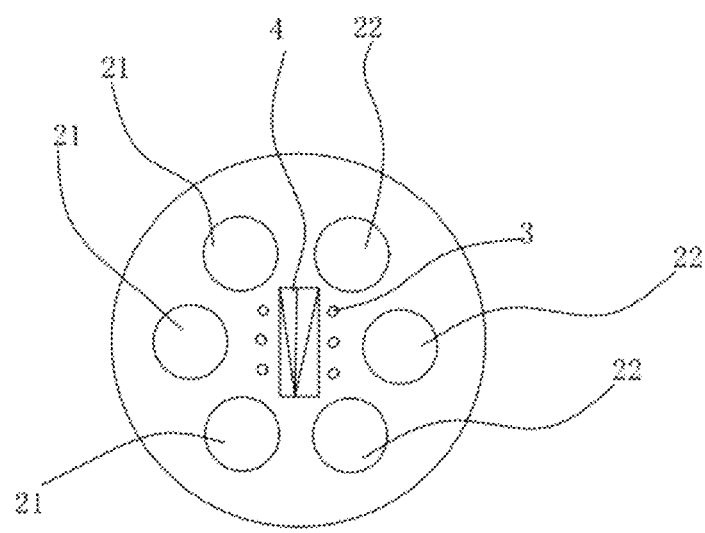
FIG. 2 is a schematic diagram of an emission source and ion source set of a device for producing a thin-film catalyst in an embodiment of the present disclosure.

FIG. 1 is a schematic diagram of a device for producing a thin-film catalyst in an embodiment of the present disclosure; and FIG. 2 is a schematic diagram of an emission source and ion source set of a device for producing a thin-film catalyst in an embodiment of the present disclosure. The present disclosure provides a device for producing a thin-film catalyst. For example, the thin-film catalyst is an MEA/HEA thin-film catalyst or an HEC thin-film catalyst or a multi-metallic element ceramic thin-film catalyst, where a metallic element ceramic refers to an oxide, a nitride, a carbide, a sulfide, or a boride of a metallic element, or a mixture (a complex) thereof. HEA refers to an alloy produced from five or more metals of equal or approximately-equal amounts. MEA is a concept developed on the basis of HEA, and is a single-phase alloy with three major elements. HEC refers to a multi-element solid solution inorganic with one or more Wyckoff site elements of a same proportion or similar proportions (5% to 35%).

The device for producing a thin-film catalyst includes vacuum chamber 1, a plurality of evaporators 2, a plurality of gas guide pipes 3, ion generator 4, and control unit 20. The vacuum chamber 1 is configured to create a vacuum environment. The plurality of evaporators 2 are arranged in the vacuum chamber 1 and are configured to evaporate at least one film material, and each of the evaporators 2 is provided with a shutter. The evaporators 2 can convert a film material into an atomic cluster, an ion source, and a partially (insufficiently)-ionic state. During an actual production process, required film materials are placed in these evaporators, respectively, and these film materials can be the same or different according to actual needs. The plurality of gas guide pipes 3 are arranged in the vacuum chamber 1 and are configured to introduce a reactive gas, where the reactive gas can be selected according to a film material composition, for example, the reactive gas can be oxygen, nitrogen, argon, or methane. The ion generator 4 is arranged in the vacuum chamber 1 and is configured to ionize the reactive gas and the evaporated film material. The control unit 20 is connected to the vacuum chamber 1, the plurality of evaporators 2, the plurality of gas guide pipes 3, and the ion generator 4. For example, the control unit 20 can control a vacuum degree, a temperature, or the like in the vacuum chamber and a current, a velocity, or the like of the evaporators 2 and the ion generator 4.

In addition, the control unit 20 is configured to control the vacuum chamber 1 to be vacuumed, control at least two evaporators of the plurality of evaporators 2 to be simultaneously started, control the plurality of gas guide pipes 3 to introduce the reactive gas, and control an ion source current of the ion generator 4 to be adjusted, such that the evaporated film material reacts with the reactive gas to form a catalytic film layer on a surface of a substrate through vapor deposition, thereby producing the thin-film catalyst of the present disclosure. For example, the catalytic film layer is a compound of a metal, or a plurality of compounds of a metal, or a composite of compounds of a plurality of metals, where the compound refers to an oxide, a nitride, a carbide, a sulfide, a boride, or a complex and the metal is Ti, V, Cr, Mn, Fe, Co, Ni, Cu, or the like.

Figure 5:
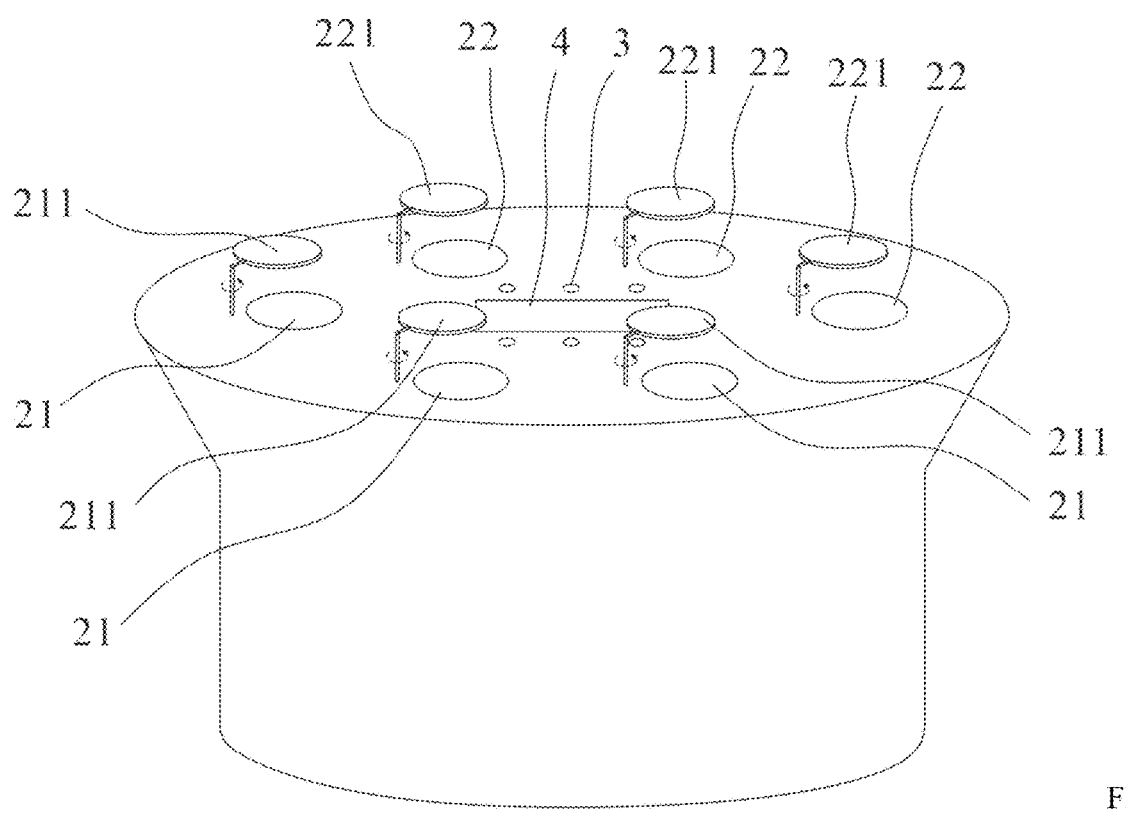
FIG. 5 is a schematic diagram showing the shutters of respective evaporators are opened.

The plurality of evaporators 2 include at least one first evaporator 21 and at least one second evaporator 22, each first evaporator 21 is provided with shutter 211, and each second evaporator 22 is provided with shutter 221, as shown in FIG. 5. For example, the first evaporator 21 is an electron beam or laser evaporator that is provided by an electron gun, and the electron gun is configured to evaporate a high-melting point material, such as a ceramic, tungsten, molybdenum, nickel, or a customized high-melting point alloy material; and the second evaporator 22 is a resistive evaporator, and the resistive evaporator is configured to evaporate a low-melting point material, such as iron, manganese, cobalt, copper, or zinc. Moreover, the film material used in the present disclosure can be a single-metal film material, or a composite film material of a plurality of metals, and can specifically be selected according to actual needs. An ion source of the ion generator 4 can be an ion source in any form. Preferably, a Hall ion source is adopted for large-scale production; and a radio frequency (RF) ion source is adopted for local regulation of disorderly dispersion of elements and orderly arrangement of crystal phases.

Figure 4:
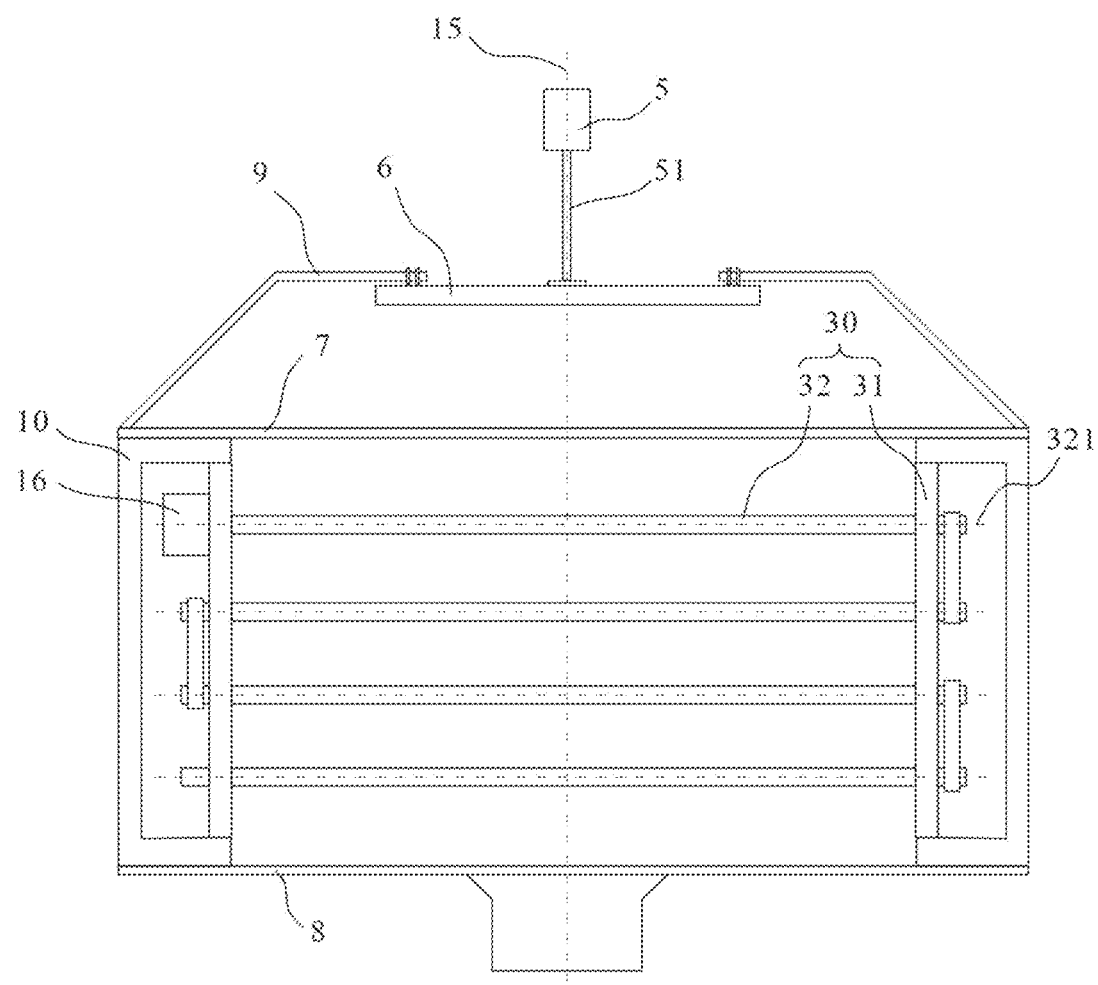
FIG. 4 is a plan view showing the winding mechanism and its structural and positional relationships with other components shown in FIG. 1.

The device for producing a thin-film catalyst further includes: winding mechanism 30, where the winding mechanism 30 is rotatably arranged in the vacuum chamber 1 and configured to drive the substrate to rotate along central axis 15 of the vacuum chamber 1. The winding mechanism 30 is connected to the control unit 20, and thus the control unit can also control a winding movement or the like of the winding mechanism 30. In this embodiment, preferably, the winding mechanism 30 is located at a side of the plurality of evaporators 2 such that the plurality of evaporators 2 can evaporate a film material towards the winding mechanism 30, but the present disclosure is not limited thereto. A position of the winding mechanism 30 is determined to allow the efficient and uniform vapor deposition of a catalytic film layer on the surface of the substrate. Further, as shown in FIG. 4, the winding mechanism 30 includes a plurality of side plates 31 and a plurality of rollers 32 rotatably connected between two opposite side plates 31. Motor 16 is provided on one of the two opposite side plates 31 for driving the rollers 32 to rotate along respective axes 321 of the rollers 32. The motor 16 can be powered by an external power source through a brush, which is well-known in the art and will not be described herein in detail.

As shown in FIG. 1, in this embodiment, the device for producing a thin-film catalyst further includes: a rotary actuator, where the rotary actuator includes motor 5, common turntable 6, first support ring 7, second support ring 8, turntable support frame 9, and winding mechanism support frame 10; the common turntable 6, the first support ring 7, and the second support ring 8 are arranged in parallel and coaxial with the vacuum chamber 1; output shaft 51 of the motor 5 is connected to a central shaft of the common turntable 6; the winding mechanism 30 is movably fixed on the winding mechanism support frame 10 through the side plates 31; the winding mechanism support frame 10 is arranged between the first support ring 7 and the second support ring 8, and two ends of the winding mechanism support frame 10 are connected to the first support ring 7 and the second support ring 8, respectively; two ends of the turntable support frame 9 are connected to the common turntable 6 and the first support ring 7, respectively; and the motor 5 can be powered by an external power source through a brush to drive the common turntable 6 to rotate to drive the winding mechanism support frame 10 to rotate and thus drive the winding mechanism 30 to rotate along the central axis 15. Accordingly, the rollers 32 of the winding mechanism 30 can be driven to rotate along the central axis 15 due to the rotation of the winding mechanism 30, which is known as revolution. Preferably, the winding mechanism support frame 10 is an integrated structure, and the winding mechanism support frame 10 is connected to the first support ring 7 through positioning buckle 11, that is, the winding mechanism support frame 10 is buckled on the first support ring 7 through the positioning buckle 11. In this way, the winding mechanism support frame 10 can stably drive the winding mechanism 30 to rotate under driving by a rotation of the first support ring 7. For example, the turntable support frame 9 can be connected to the first support ring 7 through wheel 12; and the winding mechanism support frame 10 is connected to the second support ring 8 through wheel 13.

In addition to rotating along the central axis 15 (i.e., revolution), the rollers 32 of the winding mechanism 30 can be driven by the motor 16 to rotate along their respective axes 321. That is, the rollers 32 can rotate along the central axis 15 and the axis 321 of each roller 32 simultaneously. After the substrate is located or wrapped on the winding mechanism 30, specifically on the rollers, a distance between each horizontal part of the substrate and the ion source of the ion generator 4 changes uniformly, and theoretically, during a rotation period (one revolution), there is a consistent vapor deposition rate and time of an ionic substance in the vacuum chamber for the substrate. Due to the uniform disturbance of the revolution of each roller 32 to an ionic substance in the vacuum chamber, a horizontal film layer generated has a relatively-uniform thickness. With a prototype machine of a vacuum chamber having a diameter of 1.6 m as an example, a thickness error between a horizontal middle position and a horizontal edge position of a film layer is no more than 2.4%, and a rate of authentic products is high. However, if each roller 32 does not revolve, a film layer formed through vapor deposition has a very non-uniform horizontal thickness and a poor quality. With a prototype machine of a vacuum chamber having a diameter of 1.6 m as an example, a thickness error between a horizontal middle position and a horizontal edge position of a film layer is as high as 26%. The larger the volume of the vacuum chamber, the greater the horizontal error of a film layer and the lower the rate of authentic products.

In this embodiment, the device for producing a thin-film catalyst further includes: negative bias generator 14 arranged in the vacuum chamber 1, where the negative bias generator 14 is configured to provide a negative bias for the substrate to generate an electric field in the vacuum chamber 1. Preferably, the negative bias is U, and $-380 \text{ V} \leq U < 0 \text{ V}$. A negative bias is applied to a workpiece (as a negative electrode) in the vacuum chamber 1, and a shell of the vacuum chamber 1 is set as zero potential; and a reactive gas is ionized by the ion source and argon, and resulting reaction gas ions bombard a surface of the metal workpiece under an action of the electric field and undergo a low-temperature ion reaction with surface elements. That is, the evaporators 2 evaporate a film material to convert the film material into an atomic cluster, an ion source, and a partially (insufficiently)-ionic state; and when argon is introduced into the vacuum chamber, the ion generator 4 will ionize argon, and resulting argon ions impact an evaporated film material to further ionize the evaporated film material. The addition of the electric field can also make argon fully ionized, and resulting argon ions impact an evaporated film material to further ionize the evaporated film material; and a negative electrode of the electric field attracts ions to accelerate the deposition of the ions. The electric field also plays the following special roles: (1) The electric field makes ions rapidly impact a surface of a 2D nanofilm initially generated, and a variety of different ions are inserted into the nanofilm and further react to produce more complicated compounds or complexes, which increases the amorphous or crystalline defects, and improves a catalytic effect of a film layer and the stability of catalytic active sites, especially the stability of high-temperature resistance. (2) Due to an action of the electric field, the deposition of ions on the substrate is accelerated, and a film-forming rate is increased. For example, it takes about 5 min originally to form a 30 nm-thick film, but because the deposition of ions on the substrate is accelerated due to the presence of the electric field, it only takes 3 min to form a 30 nm-thick film.

In addition, a cold trap system and a heating system are further provided in the vacuum chamber 1, where the cold trap system is provided to prepare an amorphous catalytic film, and the heating system is provided to adjust a temperature in the vacuum chamber 1 and heat a film material.

As shown in FIG. 2, because the present disclosure adopts a multi-emission source co-evaporation ion reaction method, there are a plurality of electron beam or laser evaporators 21 and a plurality of resistive evaporators 22. In this embodiment, for example, three electron beam or laser evaporators 21 and three resistive evaporators 22 are provided, but the present disclosure is not limited thereto. The numbers of the electron beam or laser evaporators and the resistive evaporators can be determined according to an actual situation. In addition, in this embodiment, ion generator 23 and six gas guide pipes 24 are further provided. Therefore, the production device of the present disclosure can allow the multi-material co-evaporation and the multi-ion reaction bonding to rapidly synthesize a target product. For example, the high-melting point film materials of tungsten (W, melting point: 3,410° C.), graphite (C, melting point: 3,850° C.), and chromium (Cr, melting point: 1,890° C.) are placed in an electron gun crucible as an electron beam evaporation source, and the low-melting point film materials of iron (Fe, melting point: 1,535° C.), copper (Cu, melting point: 1,083° C.), and zinc (Zn, melting point: 419° C.) are placed in a resistive evaporation crucible as a resistive evaporation source; and a 30 nm-thick complicated multi-metallic element carbide thin-film catalyst is prepared under the following conditions: a vapor deposition rate is set according to a vacuum sound velocity of each film material, for example, it is 1.0 Å/s for chromium and it is 2 Å/s for copper; an argon rate is set to 80 mL/s, for example; and a film-forming time is about 2 min to 3 min, which greatly shortens the film-forming time compared with the production devices in the prior art. If nitrogen is added, a complicated multi-metallic element carbonitride ceramic thin-film catalyst can be synthesized.

For example, the substrate is one or a combination of two or more of zeolite, an electrospun nanofiber, a glass fiber, a ceramic fiber, a foamed ceramic, and an alloy wire mesh.

In this embodiment, one winding mechanism is provided in the vacuum chamber as an example for illustration, but the present disclosure is not limited thereto. In actual production, a plurality of the winding mechanisms can be provided as needed to meet the needs of large-scale production.

Figure 3:
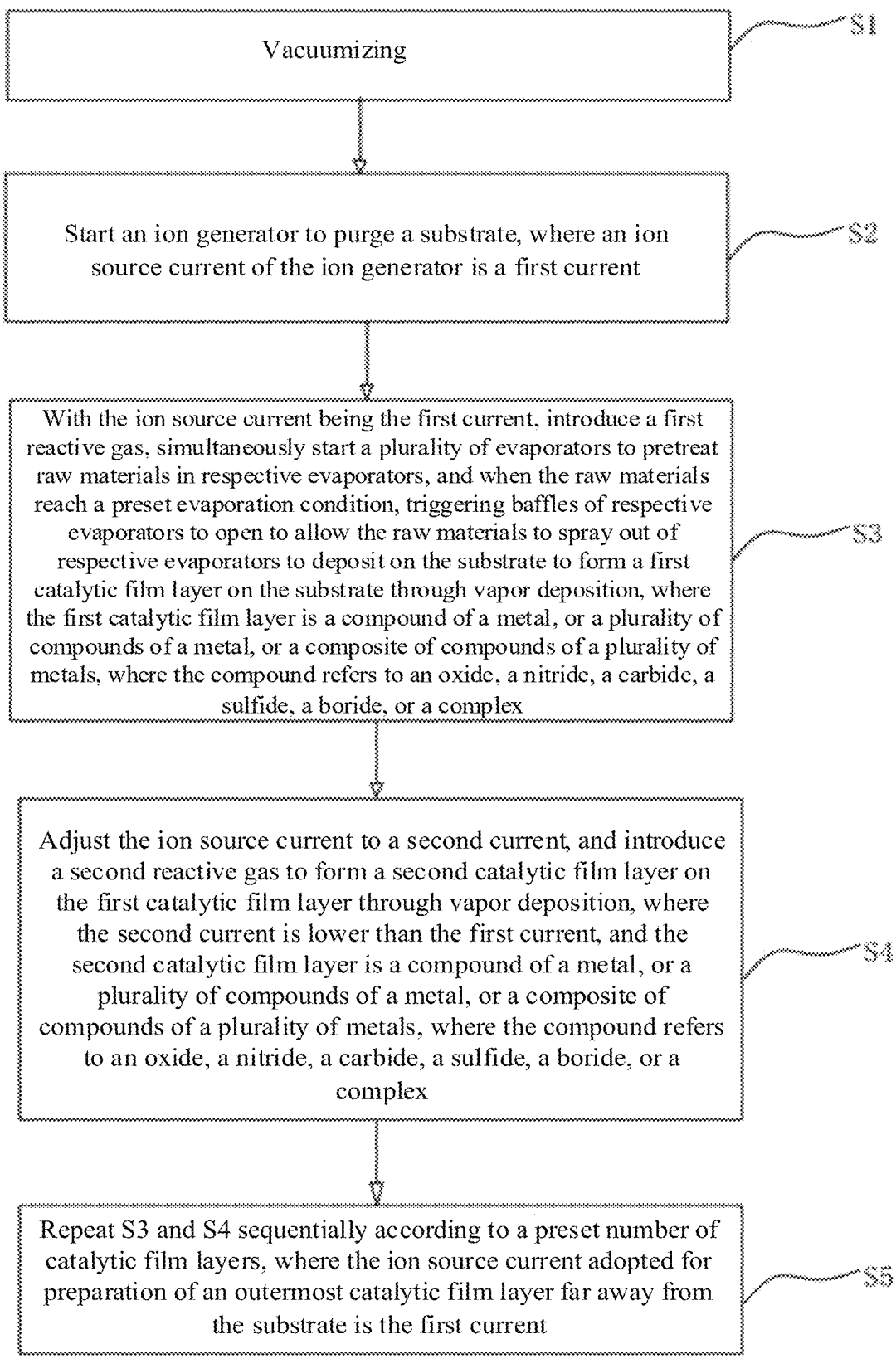
FIG. 3 is a schematic flow chart of a method for producing a thin-film catalyst in an embodiment of the present disclosure.

FIG. 3 is a schematic flow chart of a method for producing a thin-film catalyst in an embodiment of the present disclosure. The present disclosure also provides a method for producing a thin-film catalyst, using the device for producing a thin-film catalyst described above, including:

step 1: vacuuming of the vacuum chamber is started;

step 2: the ion generator is started to purge the substrate, where the ion source current of the ion generator is a first current; and step 3: with the ion source current being the first current, a first reactive gas is introduced, the plurality of evaporators are simultaneously started to pretreat raw materials in respective evaporators, and when the raw materials reach a preset evaporation condition, shutters of the respective evaporators are triggered to open to allow the raw materials to evaporate from the respective evaporators to deposit on the substrate to form a first catalytic film layer on the substrate through the vapor deposition, where the first catalytic film layer is at least one compound of a first metal or a composite of the at least one compound, where the at least one compound of the first catalytic film layer is an oxide, a nitride, a carbide, a sulfide, a boride, or a complex.

The pretreatment of the raw materials includes heating the raw materials to molten state. The raw materials include ceramics, metals, and non-metals in granular, powdered, or structured form. Preferably, the structured form is cube.

The preset evaporation condition is determined, according to different raw materials used, by the amount of the raw materials, the shape and size of beam, the current of beam, the time the beam acting on the raw materials, etc.

The shutters are triggered to open when the raw materials are monitored to reach the preset evaporation condition by a monitor configured in the control unit. Preferably, the preset evaporation condition is set the same for all evaporators such that the shutters will be triggered to open at the same time, namely, the deposition of the raw materials from the plurality of evaporators to the substrate occurs simultaneously.

The first reactive gas is selected from one of oxygen, nitrogen, and methane. The raw materials from different evaporators, after evaporating from respective evaporators, react with each other and combined with the first reactive gas to form compound(s) to deposit on the substrate to form the first catalytic film layer. For example, when oxygen is used as the first reactive gas, and molten iron and molten nickel are evaporate from different evaporators, iron, nickel, and oxygen will react and combined to form compound $Fe_xNi_yO_z$.

After the step 3, the method further includes:

step 4: the ion source current is adjusted to a second current, and a second reactive gas is introduced to form a second catalytic film layer on the first catalytic film layer through the vapor deposition, where the second current is smaller than the first current, and the second catalytic film layer is at least one compound of a second metal or a composite of the at least one compound, where the compound of the second catalytic film layer is an oxide, a nitride, a carbide, a sulfide, a boride, or a complex; and step 5: the step 3 and the step 4 are repeated sequentially according to a preset number of the catalytic film layer, where the ion source current adopted for a preparation of an outermost catalytic film layer far away from the substrate is the first current. The preset number of the catalytic film layer refers to a number of catalytic film layers to be prepared, and can be set according to actual needs.

The first reactive gas and the second reactive gas both are selected from one of oxygen, nitrogen, and methane, and the first reactive gas and the second reactive gas can be the same or different.

Argon is also introduced in the step 2, for example, argon is introduced at 15 sccm to 30 sccm in the step 2. The argon can serve as a protective gas, and can also be conducive to a reaction after being ionized. Preferably, a flux of the argon in the step 3 is equal to a flux of the argon in the step 4, and the flux may be 8 sccm to 10 sccm, for example.

In the step 2, the reactive gas has a first flux; in the step 3, the reactive gas has a second flux; and the first flux is less than or equal to the second flux. For example, when the reactive gas is oxygen, the first flux of oxygen is 20 sccm to 80 sccm, and the second flux of oxygen is 80 sccm to 100 sccm. When the reactive gas is nitrogen, the first flux of nitrogen is 40 sccm to 80 sccm, and the second flux of nitrogen is 80 sccm to 100 sccm. When the reactive gas is methane, the first flux of methane is 20 sccm to 60 sccm, and the second flux of methane is 60 sccm to 80 sccm. Of course, the present disclosure is not limited to the above, that is, the first flux can also be greater than the second flux. In actual production, the different fluxes of the reactive gas are adjusted according to different materials with different prices required by different thin-film catalysts.

The first current is 5 A to 10 A, for example; and the second current is 0 A to 5 A, for example. In the above steps of the present disclosure, the ion source is started to prepare the first catalytic film layer at a high current (such as 5 A to 10 A), which is relatively dense and can guarantee a binding force of the film layer to the substrate. The ion source is closed or a low current (such as 0 A to 5 A) is adopted to prepare the second catalytic film layer, which can guarantee the SSA, active sites, and catalytic performance of a catalytic film. A third layer is a relatively-dense catalytic film layer, which is intended to press the catalytic film layer with high SSA to prevent the catalytic film layer from falling off and aging. A fourth layer is a catalytic film layer with high SSA, which is intended to improve the overall catalytic performance of the material. A specific number of catalytic film layers can be determined according to actual needs, but an outermost catalytic film layer away from the substrate is always a dense layer prepared at a high current with the ion source started, otherwise it is easy to cause the falling-off and aging of the catalytic film layer. Specifically, when the first current is 0 A to 5 A, the first catalytic film layer has an SSA of 20 $m^2/g$ to 200 $m^2/g$; and when the first current is 5 A to 10 A, the first catalytic film layer has an SSA of 0.2 $m^2/g$ to 20 $m^2/g$.

In another embodiment, the first catalytic film layer and the second catalytic film layer both are a metal oxide, and the second current is 0, that is, when the second catalytic film layer is prepared, the ion source current can be closed, which can guarantee the SSA, active sites, and catalytic performance of the second catalytic film layer.

Generally, a metal oxide itself are not as excellent as metallic carbon and nitrogen compounds in terms of properties such as high-temperature resistance and density, but in the present disclosure, the ion source assistance (for example, the ion source current is started or closed or a magnitude of the ion source current is adjusted) can be adopted to allow the preparation of a catalyst with high SSA and excellent binding force and stability.

Preferably, the first catalytic film layer has a thickness of 5 nm to 30 nm and the second catalytic film layer has a thickness of 5 nm to 30 nm, but the present disclosure is not limited thereto. A thickness of each catalytic film layer prepared in the present disclosure can also be greater than 30 nm, which can be determined according to actual needs.

Film-forming times of the first catalytic film layer and the second catalytic film layer both are less than or equal to 5 min, and preferably, the film-forming times of the first catalytic film layer and the second catalytic film layer both are 2 min to 3 min.

The method for producing a thin-film catalyst is implemented by the device for producing a thin-film catalyst, for example.

That is, when the method and device for producing a thin-film catalyst in the present disclosure are used to prepare an MEA/HEA thin-film catalyst or a multi-metallic element ceramic thin-film catalyst, the thin-film catalyst can be prepared rapidly with a film-forming time basically controlled within 5 min, a film-forming quality is high, and through the assistance of ion source current adjustment, the high temperature resistance and density of metal oxides can also be improved to improve the overall performance of the thin-film catalyst.

The present disclosure will be further described below in conjunction with specific examples.

Example 1

(1) A vacuum chamber was vacuumed.

(2) An ion generator was started with an ion source current of 6 A, and argon was introduced at a flux of 15 sccm to purge a substrate for 60 s.

(3) The ion source current of 6 A remained unchanged, and the flux of argon was reduced to 8 sccm.

(4) An electron beam evaporator and a resistive evaporator were started, Al and Ti were placed in an electron gun crucible, Ce and Fe were placed in a resistive evaporation crucible, and oxygen was introduced at a flux of 20 sccm; for a Al2O3 film material, an electron gun current was set as 300 mA, and a vapor deposition rate was set as 3.0 Å/s (300 mA, 3.0 Å); for a $TiO_2$ film material, an electron gun current was set as 140 mA, and a vapor deposition rate was set as 1.0 Å/s (140 mA, 1.0 Å/s); for a $CeO_2$ film material, an electron gun current was set as 50 mA, and a vapor deposition rate was set as 0.5 Å/s (50 mA, 0.5 Å/s); for a Fe film material, an electron gun current was set as 60 mA, and a vapor deposition rate was set as 0.5 Å/s (60 mA, 0.5 Å/s); and the four materials were co-deposited for 100 s to obtain a 30 nm-thick first catalytic film layer, with a film-forming time of about 4 min.

Example 2

(1) A vacuum chamber was vacuumed.

(2) An ion generator was started with an ion source current of 6 A, and argon was introduced at a flux of 15 sccm to purge a substrate for 60 s.

(3) The ion source current of 6 A remained unchanged, and the flux of argon was reduced to 8 sccm.

(4) An electron beam evaporator and a resistive evaporator were started, Al and Ti were placed in an electron gun crucible, $CeO_2$ and Fe were placed in a resistive evaporation crucible, and oxygen was introduced at a flux of 20 sccm; for a Al2O3 film material, an electron gun current was set as 300 mA, and a vapor deposition rate was set as 3.0 Å/s (300 mA, 3.0 Å); for a $TiO_2$ film material, an electron gun current was set as 140 mA, and a vapor deposition rate was set as 1.0 Å/s (140 mA, 1.0 Å/s); for a $CeO_2$ film material, an electron gun current was set as 50 mA, and a vapor deposition rate was set as 0.5 Å/s (50 mA, 0.5 Å/s); for a Fe film material, an electron gun current was set as 60 mA, and a vapor deposition rate was set as 0.5 Å/s (60 mA, 0.5 Å/s); and the four materials were co-deposited for 100 s to obtain a 30 nm-thick first catalytic film layer, with a film-forming time of about 4 min.

(5) The electron beam evaporator and the resistive evaporator were started, the ion generator was closed, and oxygen was introduced at a flux of 80 sccm; a vapor deposition rate was set according to a vacuum sound velocity of each film material as follows: Co (190 mA, 2 Å/s), Mn (6 mA, 0.5 Å/s), W (490 mA, 0.2 Å/s), Mo (400 mA, 0.3 Å/s), and Cu (300 mA, 1.0 Å/s); and the five materials were co-deposited for 100 s to obtain a 30 nm-thick second catalytic film layer, with a film-forming time of about 4 min.

(6) The electron beam evaporator and the resistive evaporator were started, the ion generator was started with an ion source current of 6 A, and oxygen was introduced at a flux of 40 sccm; a vapor deposition rate was set according to a vacuum sound velocity of each film material as follows: Co (190 mA, 2 Å/s), Mn (6 mA, 0.5 Å/s), W (490 mA, 0.2 Å/s), Mo (400 mA, 0.3 Å/s), and Cu (300 mA, 1.0 Å/s); and the five materials were co-deposited for 100 s to obtain a 30 nm-thick third catalytic film layer, with a film-forming time of about 3 min.

Example 3

(1) A vacuum chamber was vacuumed.

(2) An ion generator was started with an ion source current of 6 A, and argon was introduced at a flux of 15 sccm to purge a substrate for 60 s.

(3) The ion source current of 6 A remained unchanged, and the flux of argon was reduced to 8 sccm.

(4) An electron beam evaporator and a resistive evaporator were started, a negative bias of –160 V was applied, Al and Ti were placed in an electron gun crucible, $CeO_2$ and Fe were placed in a resistive evaporation crucible, and oxygen was introduced at a flux of 20 sccm; for a $Al_2O_3$ film material, an electron gun current was set as 300 mA, and a vapor deposition rate was set as 3.0 Å/s (300 mA, 3.0 Å); for a $TiO_2$ film material, an electron gun current was set as 140 mA, and a vapor deposition rate was set as 1.0 Å/s (140 mA, 1.0 Å/s); for a $CeO_2$ film material, an electron gun current was set as 50 mA, and a vapor deposition rate was set as 0.5 Å/s (50 mA, 0.5 Å/s); for a Fe film material, an electron gun current was set as 60 mA, and a vapor deposition rate was set as 0.5 Å/s (60 mA, 0.5 Å/s); and the four materials were co-deposited for 100 s to obtain a 30 nm-thick first catalytic film layer, with a film-forming time of about 3 min.

(5) The electron beam evaporator and the resistive evaporator were started, the ion generator was closed, a negative bias of –80 V was applied, and oxygen was introduced at a flux of 80 sccm; a vapor deposition rate was set according to a vacuum sound velocity of each film material as follows: Co (190 mA, 2 Å/s), Mn (6 mA, 0.5 Å/s), W (490 mA, 0.2 Å/s), Mo (400 mA, 0.3 Å/s), and Cu (300 mA, 1.0 Å/s); and the five materials were co-deposited for 100 s to obtain a 30 nm-thick second catalytic film layer, with a film-forming time of about 3 min.

(6) The electron beam evaporator and the resistive evaporator were started, the ion generator was started with an ion source current of 6 A, a negative bias of –220 V was applied, and oxygen was introduced at a flux of 40 sccm; a vapor deposition rate was set according to a vacuum sound velocity of each film material as follows: Co (190 mA, 2 Å/s), Mn (6 mA, 0.5 Å/s), W (490 mA, 0.2 Å/s), Mo (400 mA, 0.3 Å/s), and Cu (300 mA, 1.0 Å/s); and the five materials were co-deposited for 100 s to obtain a 30 nm-thick third catalytic film layer, with a film-forming time of about 2 min.

Example 4

(1) A vacuum chamber was vacuumed.

(2) An ion generator was started with an ion source current of 10 Å, and argon was introduced at a flux of 24 sccm to purge a substrate for 60 s.

(3) The ion source current of 10 A remained unchanged, and the flux of argon was reduced to 10 sccm.

(4) An electron beam evaporator and a resistive evaporator were started, W and Cr were placed in an electron gun crucible, Fe and Cu were placed in a resistive evaporation crucible, and nitrogen was introduced at a flux of 20 sccm; a vapor deposition rate was set according to a vacuum sound velocity of each film material as follows: W (490 mA, 0.2 Å/s), Cr (300 mA, 1.0 Å/s), Fe (60 mA, 0.5 Å/s), and Cu (300 mA, 1.0 Å/s); and the four materials were co-deposited for 100 s to obtain a 30 nm-thick first catalytic film layer, with a film-forming time of about 3 min.

(5) The electron beam evaporator and the resistive evaporator were started, the ion source current was adjusted to 5 A, and nitrogen was introduced at a flux of 100 sccm; a vapor deposition rate was set according to a vacuum sound velocity of each film material as follows: Al (300 mA, 3.0 Å/s), $CeO_2$ (50 mA, 0.5 Å/s), Mo (400 mA, 0.3 Å/s), and Cu (300 mA, 1.0 Å/s); and the four materials were co-deposited for 100 s to obtain a 30 nm-thick second catalytic film layer, with a film-forming time of about 2 min.

(6) The electron beam evaporator and the resistive evaporator were started, the ion source current was adjusted to 10 A, and nitrogen was introduced at a flux of 80 sccm; a vapor deposition rate was set according to a vacuum sound velocity of each film material as follows: W (490 mA, 0.2 Å/s), Cr (300 mA, 1.0 Å/s), Fe (60 mA, 0.5 Å/s), Cu (300 mA, 1.0 Å/s), and $CeO_2$ (50 mA, 0.5 Å/s); and the five materials were co-deposited for 100 s to obtain a 30 nm-thick third catalytic film layer, with a film-forming time of about 2 min.

Example 5 HEA 2D Film CuFeNiMoCoTi

Mo and Ti were placed in an electron gun crucible, and Cu, Fe, Ni, and Co were placed in a resistive evaporation crucible; a vapor deposition rate was set according to a vacuum sound velocity of each film material, for example, it was 0.5 Å/s for tungsten and it was 2 Å/s for iron; and a 30 nm-thick film was prepared with a film-forming time of about 2 min.

Example 6 HEA 2D Film CrMoNiMnVWZn

Mo, V, W, Ti, and Cr were placed in an electron gun crucible, and Mn, Ni, and Zn were placed in a resistive evaporation crucible; a vapor deposition rate was set according to a vacuum sound velocity of each film material, for example, it was 1.0 Å/s for molybdenum and it was 3 Å/s for iron; and a 50 nm-thick film was prepared with a film-forming time of about 3 min.

Example 7 Multi-Metallic Element Ceramic 2D Film FeCrWCuN

W and Cr were placed in an electron gun crucible, Fe and Cu were placed in a resistive evaporation crucible, and nitrogen was introduced at a flow rate of 80 mL/s, for example; a vapor deposition rate was set according to a vacuum sound velocity of each film material, for example, it was 1.0 Å/s for chromium and it was 2 Å/s for copper; and a 30 nm-thick film was prepared with a film-forming time of about 2 min to 3 min.

Example 8 Multi-Metallic Element Ceramic 2D Film AlCeCoZrMnO

Zr and CeO were placed in an electron gun crucible, Al, Co, and Mn were placed in a resistive evaporation crucible, and oxygen was introduced at a flow rate of 60 mL/s, for example; a vapor deposition rate was set according to a vacuum sound velocity of each film material, for example, it was 1.0 Å/s for zirconium and it was 2.5 Å/s for manganese; and a 40 nm-thick film was prepared with a film-forming time of about 2 min to 3 min.

Example 9

A nitride ceramic film synthesized through co-evaporation of Al, Ce, Mo, Co, Zr, and Fe was used to treat dimethyl acetamide (DMAC) (volatile organic compound (VOC)) at 240° C. to 250° C., and an excellent treatment effect was allowed, where the VOC was directly treated into water, carbon dioxide, and nitrogen through the catalyst.

Example 10

Cu-based 3-metallic element oxide ceramic thin-film catalysts with a non-woven fabric and a stainless steel wire mesh as substrates each exhibited a killing efficiency of more than 98.8% within 1 min and a killing efficiency of more than 99% within 10 min for coronavirus H1N1.

It can be seen from Examples 1 to 8 that, when the method in the present disclosure is used to prepare an MEA/HEA thin-film catalyst or a multi-metallic element ceramic thin-film catalyst, the thin-film catalyst can be rapidly prepared, and a film-forming time for a 30 nm-thick film can be basically controlled within 2 min to 3 min.

The experimental conditions in Example 2 are the same as the experimental conditions in Example 3, except that a negative bias is applied in Example 3. It can see that the film-forming time in Example 3 is significantly shortened.

In Example 9, the nitride ceramic film prepared by the method of the present disclosure is used to treat DMAC (VOC) at 240° C. to 250° C., and an excellent treatment effect is allowed. However, if a nitrogen-containing VOC-targeted catalyst prepared by the impregnation or saturation co-precipitation method in the prior art is to allow the same efficiency as the multi-metallic element ceramic thin-film catalyst prepared in the present disclosure, an operation temperature needs to be increased by 150° C. to 250° C., or a rate of the VOC to pass through the catalyst needs to be reduced to 1.6 cm/s, where a rate of the VOC to pass through the thin-film catalyst of the present disclosure is 20 cm/s (according to industrial needs, a rate after the treatment can be designed to be 1 m/s to 7 m/s). When the hydrothermal method is used to prepare a cobalt nitride catalyst with high binding force and high dispersion, magnesium hydroxide needs to be used as a template, cobalt acetate and o-phenanthroline (a nitrogen source) need to be adopted as precursors, and after a reaction at 200° C., the magnesium hydroxide template needs to be removed through acid-washing. Compared with the method of the present disclosure, impurities are introduced in the hydrothermal method, and an accuracy of the hydrothermal method is not comparable to an accuracy of the vapor deposition or sputtering method. When the method of the present disclosure is used for industrial production of a multi-metallic element ceramic thin-film catalyst, a device investment for treatment of such VOCs can be reduced by ⅓ to ½, and an operation process does not consume a large amount of a natural gas, or the electrical energy for heating can be greatly reduced, thereby reducing an operation cost.

In Example 10, the products for killing the coronavirus prepared through in-situ growth of a multi-metallic element ceramic thin-film catalyst on the non-woven fabric and stainless steel wire mesh have excellent effects. Since the method of the present disclosure can allow the industrial production of a multi-metallic element ceramic thin-film catalyst, the multi-metallic element ceramic thin-film catalyst can be widely used in environmental protection, medical and health systems, central air-conditioning systems of buildings such as CBD, and rapid coronavirus killing of air purification systems of confined spaces such as high-speed trains and airplanes.

In summary, in the present disclosure, a multi-emission source co-evaporation ion reaction method is used in combination with an ion source+argon mixed ionization method, which can not only solve the problem that a non-co-evaporated film catalyst has poor high-temperature resistance, but also make various element ions in the vacuum chamber collide with each other under a joint action of accelerated impacts of an ion source and argon ions to allow an ion reaction and make a reaction product quickly deposited on a target substrate to form a sub-nano-scale or nano-scale amorphous or crystalline thin-film. In the present disclosure, a film material is excited to produce ions at a high speed, and ions react with each other rapidly, such that a film-forming time is short, which can allow a rapid and large-scale multi-metal element ion reaction to prepare MEA/HEA thin-film catalysts and multi-metallic element ceramic thin-film catalysts, and lays a foundation for industrial large-scale production. In the present disclosure, a negative bias is also applied on the substrate in the vacuum chamber to accelerate the deposition of ions or compounds and further allow an ion reaction on a primary film, so as to produce increased HEAs or complexes, which can improve the stability of active sites of a catalyst, especially the stability of high-temperature resistance. In addition, the production system of the present disclosure involves cheap raw materials, and a cost of raw materials (film materials) of the production system is greatly reduced compared with a cost of magnetron sputtering targets. The production process of the present disclosure does not produce acids, alkalies, and solid and liquid waste, and a small amount of a vacuuming gas involved by the production process can meet discharge standards and be discharged after being filtered through a simple gas filter, indicating that the production process is eco-friendly. Moreover, the production process of the present disclosure is reliable and stable.

The present disclosure has been described with reference to the above embodiments, but the above embodiments are merely examples to implement the present disclosure. In addition, the technical features involved in the different implementations of the present disclosure described below may be combined with each other as long as they do not constitute a conflict with each other. It should be noted that the disclosed embodiments do not limit the scope of the present disclosure. On the contrary, changes and modifications made without departing from the spirit and scope of the present disclosure are within the protection scope of the present disclosure.

What is claimed is:

1. A device for producing a thin-film catalyst, comprising:
   a vacuum chamber configured to create a vacuum environment;
   a plurality of evaporators arranged in the vacuum chamber and configured to evaporate at least one film material;
   a plurality of gas guide pipes arranged in the vacuum chamber and configured to introduce a reactive gas;
   an ion generator arranged in the vacuum chamber and configured to ionize the reactive gas and an evaporated film material; and
   a control unit connected to the vacuum chamber, the plurality of evaporators, the plurality of gas guide pipes, and the ion generator, wherein the control unit is configured to control the vacuum chamber to be vacuumed, control at least two evaporators of the plurality of evaporators to be simultaneously started, control the plurality of gas guide pipes to introduce the reactive gas, and control an ion source current of the ion generator to be adjusted, such that the evaporated film material reacts with the reactive gas to form a catalytic film layer on a surface of a substrate through vapor deposition;
   wherein the thin-film catalyst is a medium-entropy alloy (MEA)/high-entropy alloy (HEA) thin-film catalyst or a high-entropy ceramic (HEC) thin-film catalyst or a multi-metallic element ceramic thin-film catalyst;
   the device further comprises a winding mechanism, wherein the winding mechanism is arranged in the vacuum chamber and configured to rotate the substrate along a central axis of the vacuum chamber, the winding mechanism comprises a plurality of plates and a plurality of rollers connected between two opposite side plates of the plurality of plates, each of the plurality of rollers rotates along an axis perpendicular to the central axis of the vacuum chamber, the substrate is conveyed along the plurality of rollers.

2. The device for producing the thin-film catalyst according to claim 1, wherein the plurality of evaporators comprise at least one first evaporator and at least one second evaporator; and the at least one first evaporator is an electron beam or a laser evaporator, and the at least one second evaporator is a resistive evaporator.

3. The device for producing the thin-film catalyst according to claim 1, further comprising: a rotary actuator, wherein the rotary actuator comprises a motor, a common turntable, a first support ring, a second support ring, a turntable support frame, and a winding mechanism support frame; the common turntable, the first support ring, and the second support ring are arranged in parallel; an output shaft of the motor of the rotary actuator is connected to a central shaft of the common turntable; the winding mechanism is movably fixed on the winding mechanism support frame; the winding mechanism support frame is arranged between the first support ring and the second support ring, and two ends of the winding mechanism support frame are connected to the first support ring and the second support ring, respectively; two ends of the turntable support frame are connected to the common turntable and the first support ring, respectively; and the motor of the rotary actuator drives the common turntable to rotate to drive the winding mechanism support frame to rotate and thus drive the winding mechanism to rotate.

4. The device for producing the thin-film catalyst according to claim 1, further comprising a negative bias generator arranged in the vacuum chamber, wherein the negative bias generator is configured to provide a negative bias to generate an electric field in the vacuum chamber.

5. The device for producing the thin-film catalyst according to claim 4, wherein the negative bias is U, and $-380\ V \leq U < 0\ V$.

6. The device for producing the thin-film catalyst according to claim 1, further comprising a cold trap system and a heating system, wherein the cold trap system and the heating system are arranged in the vacuum chamber.

7. The device for producing the thin-film catalyst according to claim 1, wherein an ion source of the ion generator is a Hall ion source.

8. A method for producing the thin-film catalyst using the device according to claim 1, comprising:
   step 1: starting vacuuming of the vacuum chamber;
   step 2: starting the ion generator to purge the substrate, wherein the ion source current of the ion generator is a first current; and
   step 3: with the ion source current being the first current, introducing a first reactive gas, simultaneously starting the plurality of evaporators to pretreat raw materials in respective evaporators, and when the raw materials reach a preset evaporation condition, triggering shutters of the respective evaporators to open to allow the raw materials to evaporate from the respective evaporators to deposit on the substrate to form a first catalytic film layer on the substrate through the vapor deposition, wherein the first catalytic film layer is at least one compound of a first metal or a composite of the at least one compound, wherein the at least one compound of the first catalytic film layer is an oxide, a nitride, a carbide, a sulfide, a boride, or a complex.

9. The method for producing the thin-film catalyst according to claim 8, wherein after the step 3, the method further comprises:
   step 4: adjusting the ion source current to a second current, and introducing a second reactive gas to form a second catalytic film layer on the first catalytic film layer through the vapor deposition, wherein the second current is smaller than the first current, and the second catalytic film layer is at least one compound of a second metal or a composite of the at least one compounds, wherein the at least one compound of the second catalytic film layer is an oxide, a nitride, a carbide, a sulfide, a boride, or a complex; and
   step 5: repeating the step 3 and the step 4 sequentially according to a preset number of the catalytic film layer, wherein the ion source current adopted for a preparation of an outermost catalytic film layer far away from the substrate is the first current.

10. The method for producing the thin-film catalyst according to claim 9, wherein the first reactive gas and the second reactive gas both are selected from one of oxygen, nitrogen, and methane.

11. The method for producing the thin-film catalyst according to claim 9, wherein the first catalytic film layer and the second catalytic film layer both are a metal oxide, and the second current is 0.

12. The method for producing the thin-film catalyst according to claim 9, wherein the first current is 5 A to 10 A, and the second current is 0 A to 5 A.

13. The method for producing the thin-film catalyst according to claim 9, wherein a film-forming time of the first catalytic film layer and a film-forming time of the second catalytic film layer both are less than or equal to 5 min.

14. The method for producing the thin-film catalyst according to claim 9, wherein in the step 2, argon is also introduced.

15. The method for producing the thin-film catalyst according to claim 14, wherein a flux of the argon in the step 3 is equal to a flux of the argon in the step 4.

16. The method for producing the thin-film catalyst according to claim 9, wherein the second catalytic film layer has a thickness of 5 nm to 30 nm.

17. The method for producing the thin-film catalyst according to claim 16, wherein the first catalytic film layer has a thickness of 5 nm to 30 nm.

18. The method for producing the thin-film catalyst according to claim 8, wherein the first catalytic film layer has a thickness of 5 nm to 30 nm.

19. The method for producing the thin-film catalyst according to claim 8, wherein the step 3 further comprises: providing a negative bias to generate an electric field, wherein the negative bias is U, and $-380\text{ V} \leq U < 0\text{ V}$.

20. The method for producing the thin-film catalyst according to claim 19, wherein a film-forming time of the first catalytic film layer is 2 min to 3 min.

21. The method for producing the thin-film catalyst according to claim 8, wherein when the first current is 0 A to 5 A, the first catalytic film layer has a specific surface area (SSA) of 20 $m^2/g$ to 200 $m^2/g$; and when the first current is 5 A to 10 A, the first catalytic film layer has an SSA of 0.2 $m^2/g$ to 20 $m^2/g$.

* * * * *